Feb. 2, 1965 T. M. ELFVING 3,167,925

THERMOELECTRIC COOLING DEVICE

Filed March 14, 1963

3 Sheets-Sheet 1

INVENTOR.
THORE M. ELFVING
BY
Flehr and Swain
ATTORNEYS

Feb. 2, 1965 T. M. ELFVING 3,167,925

THERMOELECTRIC COOLING DEVICE

Filed March 14, 1963 3 Sheets-Sheet 2

INVENTOR.
THORE M. ELFVING
BY
Flehr and Swain
ATTORNEYS

Feb. 2, 1965 T. M. ELFVING 3,167,925

THERMOELECTRIC COOLING DEVICE

Filed March 14, 1963 3 Sheets-Sheet 3

INVENTOR.
THORE M. ELFVING
BY
Flehr and Swain
ATTORNEYS

United States Patent Office 3,167,925 Patented Feb. 2, 1965

3,167,925
THERMOELECTRIC COOLING DEVICE
Thore M. Elfving, 433 Fairfax Ave., San Mateo, Calif.
Filed Mar. 14, 1963, Ser. No. 265,129
12 Claims. (Cl. 62—3)

The present invention relates to thermoelectric cooling devices for storage or freezing in an insulated space or for cooling objects disposed on a cold surface.

Air cooled thermoelectric cooling devices are more sensitive to temperature differences than conventional refrigeration cooling devices and it is of great importance to provide large and effective heat dissipating surfaces if forced air circulation is to be avoided.

It is a general object of the invention to provide thermoelectric heat pump devices in which the heat dissipation from the hot junction side of a thermoelectric array takes place over a hermetic heat transfer system comprising a thin double walled panel formed by two wall elements facing each other and directly joined to each other at distributed areas to form a multitude of passages for a volatile heat transferring fluid inside the double walled panel.

It is another object of this invention to provide efficient air cooled thermoelectric refrigeration devices of a simple, compact and inexpensive design for storage, ice freezing or water cooling.

It is another object of this invention to provide large and effective heat dissipating surfaces for air cooled thermoelectric devices for air cooling without the use of forced air circulation as, for example, by a fan.

It is a specific object of this invention to provide a thermoelectric refrigerator and/or ice freezer in which a hermetic double-walled heat transferring panel surrounds the bottom and at least one side wall of the refrigerated space.

It is still another object of this invention to provide a thermoelectric refrigeration device such as a refrigerator, ice freezer or water cooler built inside an envelope of flat double-walled heat dissipating panels filled with a heat transferring fluid.

Additional objects and features of this invention will appear from the following description in which several embodiments of the invention are described with reference to the accompanying drawings.

Referring to the drawing.

Figures 1, 2:
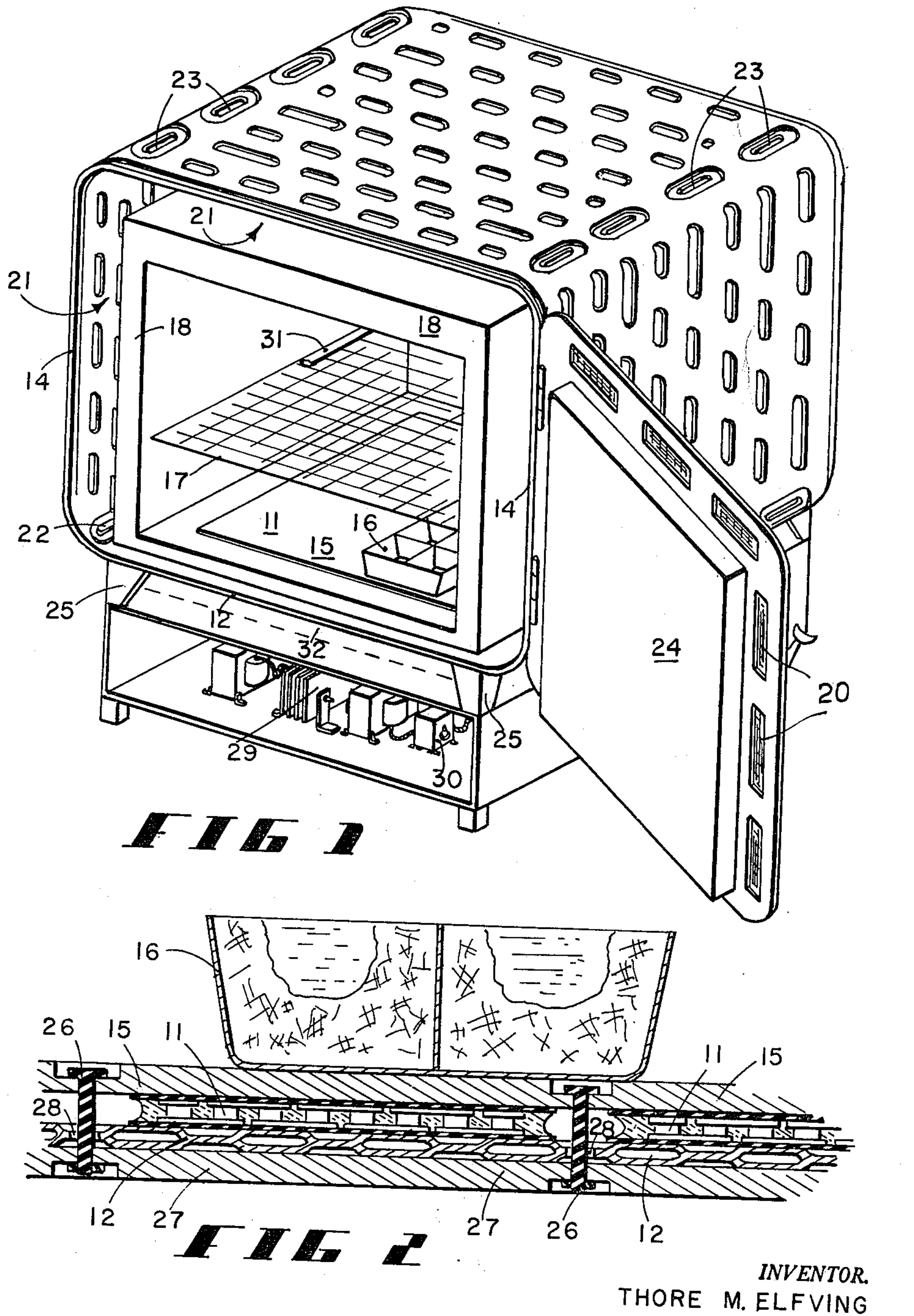
FIGURE 1 shows a thermoelectric refrigerator-ice freezer according to the invention.
FIGURE 2 shows an enlarged sectional view of the thermoelectric array of FIGURE 1.

Referring to FIGURES 1 and 2, there is shown an air cooled thermoelectric refrigerator-freezer cooled by thermoelectric heat pumps in the form of thermocouple assemblies or package units 11. The thermoelectric units 11 have their warm junction side facing downwards in direct, preferably soldered, contact with the horizontal evaporator portion 12 of a double-walled hermetic panel 14 made of a suitable metal sheet material. The hermetic panel 14 is filled with a heat transferring fluid and serves as cooling system for the hot junctions of the thermoelectric heat pump. The cover plate 15 in thermal contact with the cold junction side of the thermoelectric units 11 forms the heat absorbing floor or bottom of the refrigerated space which, in its lower portion, can be used for ice-freezing trays 16 placed on the plate 15 or for storage of frozen products. The upper portion above the shelf 17 is suitable for storage at a higher temperature. The shelf 17 is shown as being of the wire type but can also be of the plate type and provided with a suitable insulation to keep the temperature on top of the shelf above freezing.

The refrigerated space is provided with insulation 18 to form a closed refrigerator-freezer structure inside the heat dissipating metal panel 14 which forms not only the subfloor but also the outside wall and roof lining of the refrigeration cabinet 19. Thus, the refrigeration cabinet is enclosed within its own heat dissipating surfaces. The insulation 18 is spaced from the heat dissipating portion of the double walled panel to leave an air space 21 between the refrigerated structure and the panel 14 at the side walls and the roof. The air space 21 communicates with the outside air through the circulation openings or louvers 22 and 23 by which means the heat dissipating panel 14 is effectively cooled on both sides of its walls and ceiling portions. An insulated door 24 attached to the edge of the heat dissipating panel 14 closes the refrigerated space but permits air passage to the inside of the cabinet lining 19. For this purpose, the door may include louvered openings 20. The cabinet lining can also be covered at the rear end by a metal or plastic sheet at a distance from the insulation 18 to form an air space similar to the air space 21 at the side walls and the ceiling.

The horizontal evaporator portion 12 of the panel 14 is in good thermal contact with the thermoelectric package unit 11 and absorbs heat from the hot junctions of the heat pump by boiling of the heat transferring fluid inside the panel. The vapor formed is condensed in the wall and roof portions of the panel 14 in which a continuous flow of gas and liquid in counterflow is taking place in the multitude of passages which are formed in the double-walled panel structure. The wall elements may be joined directly to one another at a multitude of distributed areas over the panel to provide the aforementioned passages. The holes or louvers 22 and 23 may, according to the invention, be located in joined areas of a size larger than the remainder of the pattern as indicated on the drawing. The cabinet 19 is provided with legs 25 so that the bottom portion 12 of the panel 14 is freely exposed to the ambient air whereby this portion 12 is heat absorbing on one side and heat dissipating on the other side. In this way, the entire surface of the two-sided panel 14 is effectively cooling the thermoelectric heat pump thereby providing sufficiently large cooling surfaces so that the use of forced air circulation is unnecessary. The large cooling surfaces require a minimum of space. The entire refrigerated space is surrounded with an envelope of heat dissipating flat panels which also have the additional function of forming the outside metal lining of the refrigerated device. The design, therefore, combines maximum of air cooling efficiency with minimum of space and cost.

The panel 14 may be made from aluminum sheet metal in the form of a roll-bond panel and painted on the exterior surface with a suitable color to increase the heat transmission coefficient between the metal panel and the surrounds and to provide additionally a pleasing appearance. The inside of the panel 14 facing the insulation structure 19 can be left unpainted.

As indicated above, the thermoelectric package units 11 are metallized and soldered to the panel 12 and the cover plate 15 in order to obtain minimum thermal resistance. In order to relieve the thermoelectric units between the panel 12 and the cover plate 15 from mechanical stress, there is introduced a mechanical bond between the cover plate 15 and the panel 12 in the form of bolts 26 which secure the metal cover plate 15 to a supporting metal plate 27 below the panel 12. The bolts or screws 26, preferably made from a non-metallic material, penetrate the double-walled panel 12 through holes 28 in areas where the two wall members of the panel are joined as illustrated by the figure, similarly to the air circulating openings 22 and 23.

The thermoelectric heat pump assembly is in the usual way supplied with D.C. current from a power supply unit 29 located under the refrigerator cabinet 19. The power supply unit 29 can also be mounted on the back of the cabinet or entirely separated from the same. Temperature control can be obtained by a thermostat 30 connected to either intermittently apply alternating current to the power supply or switch the power supply, or switch the D.C. current from a higher value to a lower value when the set point of the thermostat is satisfied thereby diminishing the heat pumping capacity of the thermoelectric assembly to such an extent that temperature equalization between the hot and cold junction sides is barely prevented. When the sensitive bulb 31 of the thermostat in the refrigerated space calls for more refrigeration, the thermostat switches back to the higher energy input which is chosen so that the input current corresponds to maximum coefficient of performance at maximum temperature deficiency between the hot and cold sides of the thermoelectric unit.

When intermittent operation is used by interruption of the A.C. supply, heat losses through temperature equalization are reduced by insulating the underside of the panel portion 12 and its supporting plate 27. Such an insulation 32 is schematically shown in FIGURE 1 in dotted line.

The insulation structure 18 shown in FIGURE 1 can, according to the invention, be substituted by a preferably transparent radiation shield located where the outside of the insulation 18 is shown. Instead of the insulated door 20, the cabinet 19 (panel 14) can be closed in the front by a transparent sheet or left open so that the whole device can serve as a refrigerated display case suitable for window displays.

Figure 6:
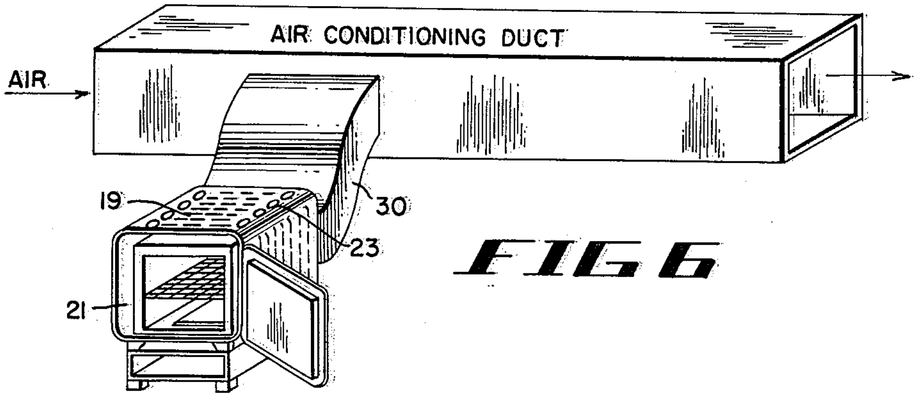
FIGURE 6 illustrates connection of the refrigerator cabinet to an air conditioning duct.

The refrigerator cabinet 19 enclosed in its own heat dissipating panel 14 can, according to the invention, be installed as part of a ventilating or air conditioning system (FIGURE 6) whereby the panel 14 is cooled by air flowing through the system. The connection to the corresponding air duct system is preferably made at the rear end of the cabinet 19 so that pressurized air is entering the air space 21 between the refrigerated structure and the heat dissipating panel 14. The panel 14 is thereby effectively cooled on the whole inside surface by relatively cold air, the air space 21 acting as a plenum and the holes 22 and 23, which should be of proper size, serving as outlet for the cooling air. Such an arrangement, according to the invention, is especially desirable for cooling cabinets or ice freezers used in automobiles or in hotel rooms where air conditioning is available. The duct connection to the pressurized air system can be relatively small and can, according to the invention, even be made flexible in the form of, for instance, a foam rubber hose 30 so that the refrigerator cabinet can be moved and disconnected when desired. If permanently connected to a pressurized ventilating or air conditioning system, the refrigerator or ice freezer can be of the built-in type as cooling by natural convection is no longer needed.

Figure 3:
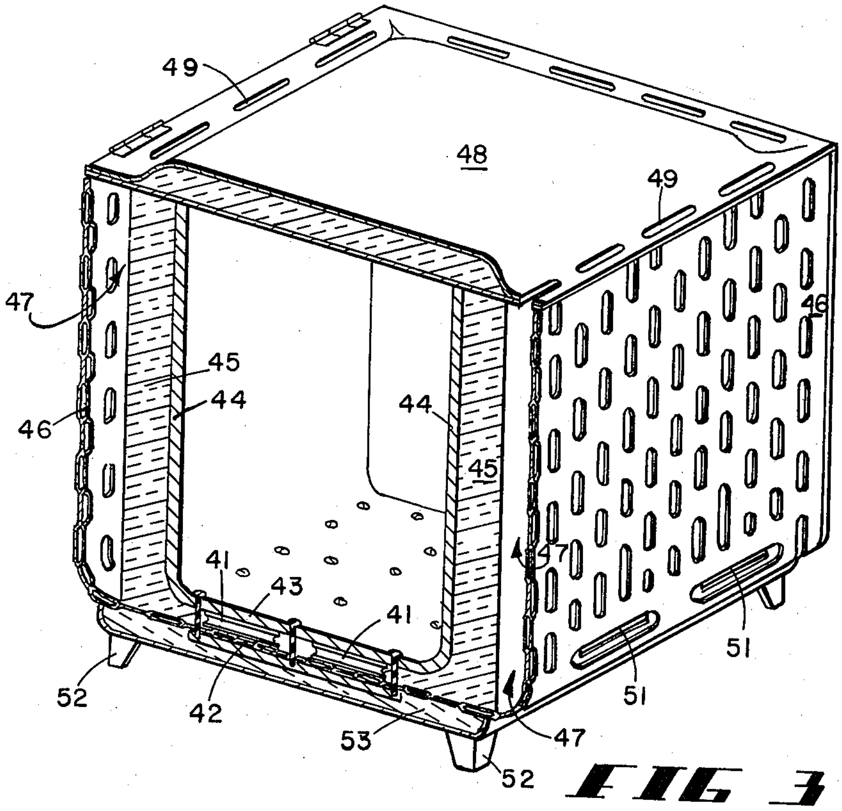
FIGURE 3 shows another type of thermoelectric refrigerating device in the form of a storage container.

FIGURE 3 shows another modification of the refrigerator freezer according to the invention. A thermo-electric heat pump assembly 41 is as before placed with its hot side downwards in intimate thermal contact with the horizontal evaporator portion of a heat transferring double-walled, preferably bonded, aluminum panel 42. On the cold junction side, the heat pump assembly is bonded, bolted or soldered to a heat conducting container

43, for instance, made from cast aluminum. The square container 43 has relatively thick walls 44 for good heat conductivity, is open at the top and is on all sides provided with an insulation 45 as indicated on the drawing. The double-walled panel 42 underneath the heat pump assembly 41 is bent upwards to form an outside lining 46 around the insulated container 43, 44 leaving an air space 47 between the lining 46 and the insulation 45. In FIGURE 3 is indicated how the panel 42 forms two sides of the refrigerated structure. The other two sides can be closed by sheet metal or a plastic material on top of the insulation. The refrigerated container 43, 44 is closed at the top by the partly insulated lid 48 as illustrated in the figure. Holes 49 in the lid 48 and holes 51 in the bottom portion of the panel 42 are useful for air circulation by natural convection in the air space 47, the legs 52 facilitate air circulation also around the underside of the horizontal portion of the heat transferring panel 42 which is filled with a boiling and condensing agent. The panel in its entirety provides effective and large heat dissipating surfaces for the heat developed at the hot junction side of the heat pumping assembly 41 and serves at the same time as an important structural member of the whole refrigerated container, namely, as the outside metal lining in which the container is built. The assembly 41 is supplied with D.C. current from a power supply (not shown in the picture) and its cooling action can, in the usual way, be regulated by a thermostat as previously described in connection with FIGURES 1 and 2. If intermittent operation is chosen, the bottom portion of the panel 42 is preferably insulated by an insulation 53.

Figure 4:
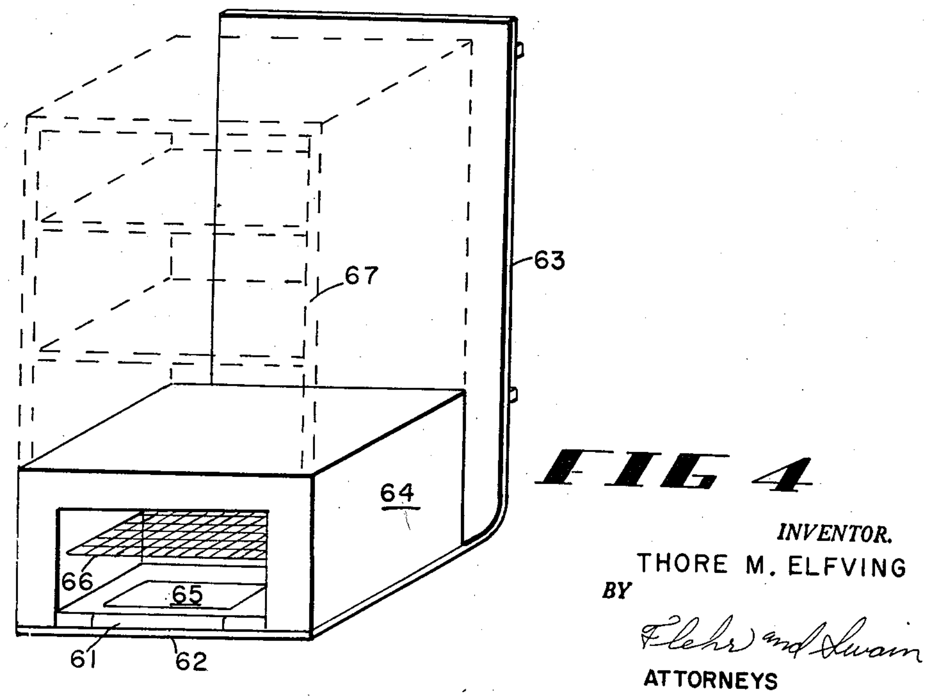
FIGURE 4 shows still another type of refrigerator device according to the invention.

In FIGURE 4 is shown schematically another embodiment of the invention. A thermoelectric heat pump assembly 61 is placed with its hot junction side downward against the horizontal heat absorbing portion 62 of a double-walled heat transferring panel of the type previously described having a vertical heat dissipating portion 63 of substantially larger height than the insulated refrigerator structure 64 built over the heat pump assembly 61. The insulated structure 64 is cooled by the metal cover plate 65 on top of the cold junction side of the heat pump forming the bottom of the refrigerated space on which ice freezing can take place in the usual way. A shelf 66 is also shown in the figure. The vertical panel portion 63 behind the refrigerator structure can be hung on a wall with a small air gap in between for air cooling on both sides. A heat dissipating system of this wall panel type requires practically no space but provides very effective air cooling of thermoelectric heat pump devices. In the drawing is indicated by dotted lines how other non-refrigerated cabinets can be built on top of the refrigerated structure with the vertical portion of the heat dissipating panel forming the back of said cabinets.

A modification of the thermoelectric heat pump device shown in FIGURE 4 comprises a similar heat transferring double-walled panel with a horizontal portion and an extended vertical portion but with its horizontal portion attached to a heat pump assembly placed underneath the horizontal portion with its hot junction side facing upwards. The cold junction side of the heat pump facing downwards can, in this alternative design, be provided with a plain or finned cover plate to cool the inside space of an insulated structure built underneath the horizontal panel portion instead of over the same as shown in the figure.

A hermetic heat dissipating wall panel for air cooling of a thermoelectric heat pump of the type described can also, according to the invention, be entirely vertical in its full length with the heat pump assembly attached with its hot junction side towards the panel at the lower heat absorbing portion of the same. The cold junction side with its metal cover plate formed as an ice freezing radiator or as a fin radiator can, in the usual way, be surrouded by an insulated structure to form a refrigerator backed by the heat transferring wall panel which, as previously stated, can be extended vertically substantially higher than the top of the refrigerator structure without taking up any extra space when placed against a wall whether additional—not refrigerated—structures are attached to the panel or not. Thus, it has been shown that flat double-walled heat transferring panels serving as heat dissipating means for air cooled thermoelectric heat pumps, according to the invention, can serve as useful building elements of the refrigerator structure itself and at the same time provide large effective surfaces for air cooling by natural convection without adding to the space taken up by the refrigerator.

Figure 5:
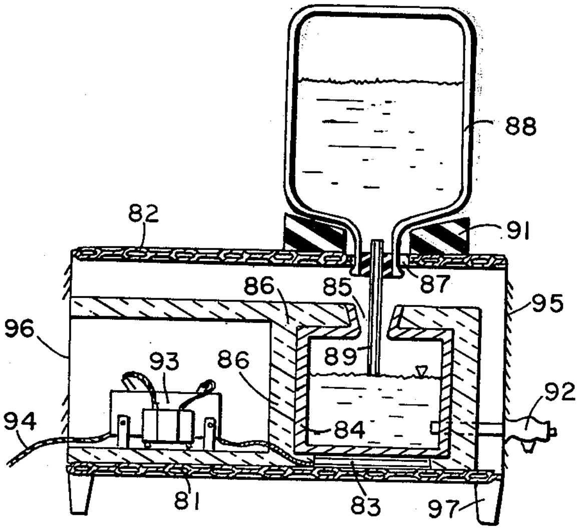
FIGURE 5 shows a water cooler incorporating the invention.

FIGURE 5 shows a sectional side view of a water cooler according to the invention. A double-walled heat transferring cooling panel similar to the panel in FIGURE 1 has a floor portion 81 and a ceiling portion 82 shown in section. Against the floor portion 81 is bolted, bonded or soldered a thermoelectric heat pump assembly 83 with its hot junction side facing downwards in intimate thermal contact with the panel. The cold junction side of the assembly 83 is protected by a metal cover plate in the usual way, to which is soldered, bolted or bonded, the bottom of a water container 84 preferably made from copper and tinned or coated on the inside with a suitable material. The container 84 has a funnel-shaped opening 85 in the ceiling portion but is otherwise insulated on all sides with an insulation 86 as shown in the figure. The ceiling portion 82 of the double-walled cooling panel has an opening 87 through which the neck of a water bottle 88 with an extension pipe 89 can be placed when the full bottle 88 is turned upside down resting on the insulated support 91 on top of the panel 82. The extension pipe 89 reaches through the opening 85 into the container 84 in which the water level will be determined by the end of the extension pipe 89. When water is tapped out of the container 84 through the faucet 92, the system will function to maintain the level of the water.

The heat pump 83 is energized with D.C. current from the power supply 93 which is fed with electric energy by the A.C. leads 94. The water cooler works by energizing the thermoelectric heat pump which is cooling the water in the container 84 on the cold junction side. The heat from the hot junction side is dissipated from the whole panel system which is closed at the front and rear ends by perforated or louvered metal or plastic covers 95 and 96 for air circulation inside the space enclosed by the heat dissipating panel system. An air space at the inside panel surfaces is left at the walls, ceiling and end between the insulated structure and the panel, as described in connection with FIGURE 1. The air space enclosed by the panel can be connected to an air conditioning system by a hose or similar duct connection to an opening in the cover 96 at the rear end. The water cooler is provided with legs 97 as a desk cooler but can be adapted to be built as a floor water cooler.

In the figures are shown double-walled panels with joined surface areas and expanded to both sides. It is obvious that panels with only one sided expansion can be used with the smooth surface on the outside of the refrigerator device. It is also obvious that in certain cases a fan can be mounted in the air space between the panel and the refrigerated structure for maximum heat dissipation from the panel. Cooling by water flowing over the panel surface is also an alternative as is evaporation cooling by water and simultaneous air circulation on top of the panel surface.

The hermetic heat dissipating panel for cooling of a thermoelectric refrigerating device, described above, can, according to the invention, be thermally connected with heat sinks of any kind and particularly to heat sinks in the form of air conditioning ducts in automobiles and rooms. The panel can also be designed to form a section of such a duct to form the bottom or top of a horizontal duct, or to form a side wall of a vertical duct. If thermally connected to a horizontal duct and forming a bottom or top side thereof, the heat dissipating portion of the panel can have a substantially horizontal position with the horizontal heat absorbing portion located at a slightly lower level to allow the back flow of condensate by gravity. This is illustrated by bending the vertical panel portion 63 in FIGURE 4 backwards into a substantially horizontal position or by bending the sides 46 of the panel in FIGURE 3 outwards into a substantially horizontal or slightly sloping position. Thus, the refrigerated structure can, according to the invention, be built with the hot junction side of the thermoelectric heat pump cooling the same in thermal contact with the horizontal heat absorbing portion of a heat transferring panel with the heat dissipating portion of the panel also substantially horizontal but with the heat absorbing portion constituting the lowest portion of the whole panel.

I claim:

1. A thermoelectrically refrigerated device comprising a horizontal thermocouple array with hot and cold junction sides, said cold junction sides facing upward and said hot junction sides facing downward, a metal cover plate in heat exchange relationship with the cold junction side, an insulated structure enclosing a refrigerated space above said metal cover plate, a double-walled hermetically sealed panel partly filled with a heat transfer medium having a horizontal heat absorbing portion in thermal contact with the hot junction side of said thermocouple assembly and supporting the thermocouple array and insulated structure, said double-walled panel having at least one vertical heat dissipating portion disposed along at least one side of said insulated structure and forming at least one outside wall of the thermoelectrically refrigerated device.

2. A thermoelectrically refrigerated device comprising a horizontal thermocouple array with hot and cold junction sides, said cold junction sides facing upward and said hot junction sides facing downward, a metal cover plate in heat exchange relationship with the cold junction side, an insulated structure enclosing a refrigerated space above said metal cover plate, a double-walled hermetically sealed panel partly filled with a heat transfer medium having a horizontal heat absorbing portion in thermal contact with the hot junction side of said thermocouple assembly, and a heat dissipating portion above said heat absorbing portion, said heat absorbing and heat dissipating portions of said panel surrounding the refrigerated space on four sides to form an outside bottom, top and side wall lining enclosing said refrigerated device.

3. A thermoelectrically refrigerated device according to claim 2 in which said insulated structure includes portions spaced from the heat dissipating portion of said panel to form an air space.

4. A thermoelectrically refrigerated device according to claim 2 in which the insulated structure surrounds a water container in thermal contact with said cover plate.

5. A thermoelectrically refrigerated device according to claim 2 in which said insulated structure surrounds a metal storage container with its bottom in thermal contact with said metal cover plate.

6. A thermoelectrically refrigerated device according to claim 2 including a power supply for supplying direct current electric energy to said thermocouple array.

7. A thermoelectrically refrigerated device according to claim 3 in which said heat dissipating portion of the double-walled panel is provided with holes for air circulation between said air space and the surrounds.

8. A thermoelectrically refrigerated device according to claim 1 in which a vertical heat dissipating portion of said double-walled panel forms the back of the refrigerated device and extends vertically above the top of the insulated structure.

9. A thermoelectrically refrigerated device according to claim 8 in which said vertically extending heat dissipating portion of the panel forms the back side of a cabinet structure.

10. A thermoelectrically refrigerated device according to claim 3 in which said air space is adapted to be placed in communication with an air conditioning air duct.

11. A thermoelectrically refrigerated device comprising a horizontal thermocouple array with hot and cold junction sides, said cold junction sides facing upward and said hot junction sides facing downward, an insulated structure enclosing a refrigerated space above said cold junction side, a double-walled hermetically sealed panel partly filled with a heat transfer medium having a horizontal heat absorbing portion in thermal contact with the hot junction side of said thermocouple assembly, said double-walled panel having at least one vertical heat dissipating portion disposed in spaced relationship with at least one side of said insulated structure to define an air space and forming at least one outside wall of the thermoelectrically refrigerated device.

12. A thermoelectric refrigerated device comprising a horizontal thermocouple array with hot and cold junction sides, said cold junction sides facing upward and said hot junction sides facing downward, an insulated structure enclosing a refrigerated space above said cold junction side, a double-walled hermetically sealed panel partly filled with a heat transfer medium having a horizontal heat absorbing portion in thermal contact with the hot junction side of said thermocouple array and supporting the thermocouple array and insulated structure, said double-walled panel having a heat dissipating portion on a higher level than the heat absorbing portion of the panel, said heat dissipating portion being adjacent to the insulated structure and forming an exterior wall of said refrigerated device.

References Cited in the file of this patent

UNITED STATES PATENTS

| | | |
|---|---|---|
| 2,626,130 | Raskin | Jan. 20, 1953 |
| 2,947,150 | Roeder | Aug. 2, 1960 |
| 3,018,631 | Bury | Jan. 30, 1962 |